United States Patent [19]

Horiike et al.

[11] Patent Number: 5,851,600
[45] Date of Patent: Dec. 22, 1998

[54] PLASMA PROCESS METHOD AND APPARATUS

[75] Inventors: Yasuhiro Horiike, Tokyo-to; Yasuo Kobayashi, Yamanashi-ken, both of Japan

[73] Assignee: Tokyo Electron, Ltd., Tokyo-to, Japan

[21] Appl. No.: 953,624

[22] Filed: Oct. 17, 1997

Related U.S. Application Data

[63] Continuation of Ser. No. 662,649, Jun. 13, 1996, abandoned.

[30] Foreign Application Priority Data

Jun. 15, 1995 [JP] Japan .................................... 7-172938

[51] Int. Cl.$^6$ ...................................................... B05D 3/04
[52] U.S. Cl. ........................ 427/535; 118/719; 118/723 I; 118/723 IR; 118/723 MP; 156/643.1; 427/248.1; 427/294; 427/569
[58] Field of Search ................................. 118/719, 723 I, 118/723 IR, 723 MP; 156/643.1; 427/535, 248.1, 294, 569

[56] References Cited

U.S. PATENT DOCUMENTS 5,431,799  7/1995  Mosely et al. ...................... 204/298.06

OTHER PUBLICATIONS

Jpn. J. Appl. Phys. vol. 35 (1996); pp. 1474–1477 (No month avail.).

J. Vac. Sci. Technol. B 12(1), Jan./Feb. 1994; pp. 449–453.

J. Vac. Sci. Technol. B 13(2), Mar./Apr. 1995; pp. 203–208.

SSDN proceedings, 29a–R–12; p. 393 (No date avail.).

*Primary Examiner*—Bernard Pianalto
*Attorney, Agent, or Firm*—Beveridge, DeGrandi, Weilacher & Young, LLP

[57] ABSTRACT

Plasma processing gas is introduced into an upper portion of a processing vessel and a film-formation gas is simultaneously introduced into the vicinity of a substrate to be processed. The plasma processing gas is ionized to form a first plasma and any of the plasma processing gas that has temporarily recombined in locations close to the substrate to be processed is re-ionized as a second plasma. As a result, the density of etchant ions used for cutting away overhangs around the openings of grooves can be increased. In other words, the number of etchant ions can be increased. This makes it possible to reduce the bias voltage applied to the substrate to be processed, preventing damage thereto.

10 Claims, 5 Drawing Sheets

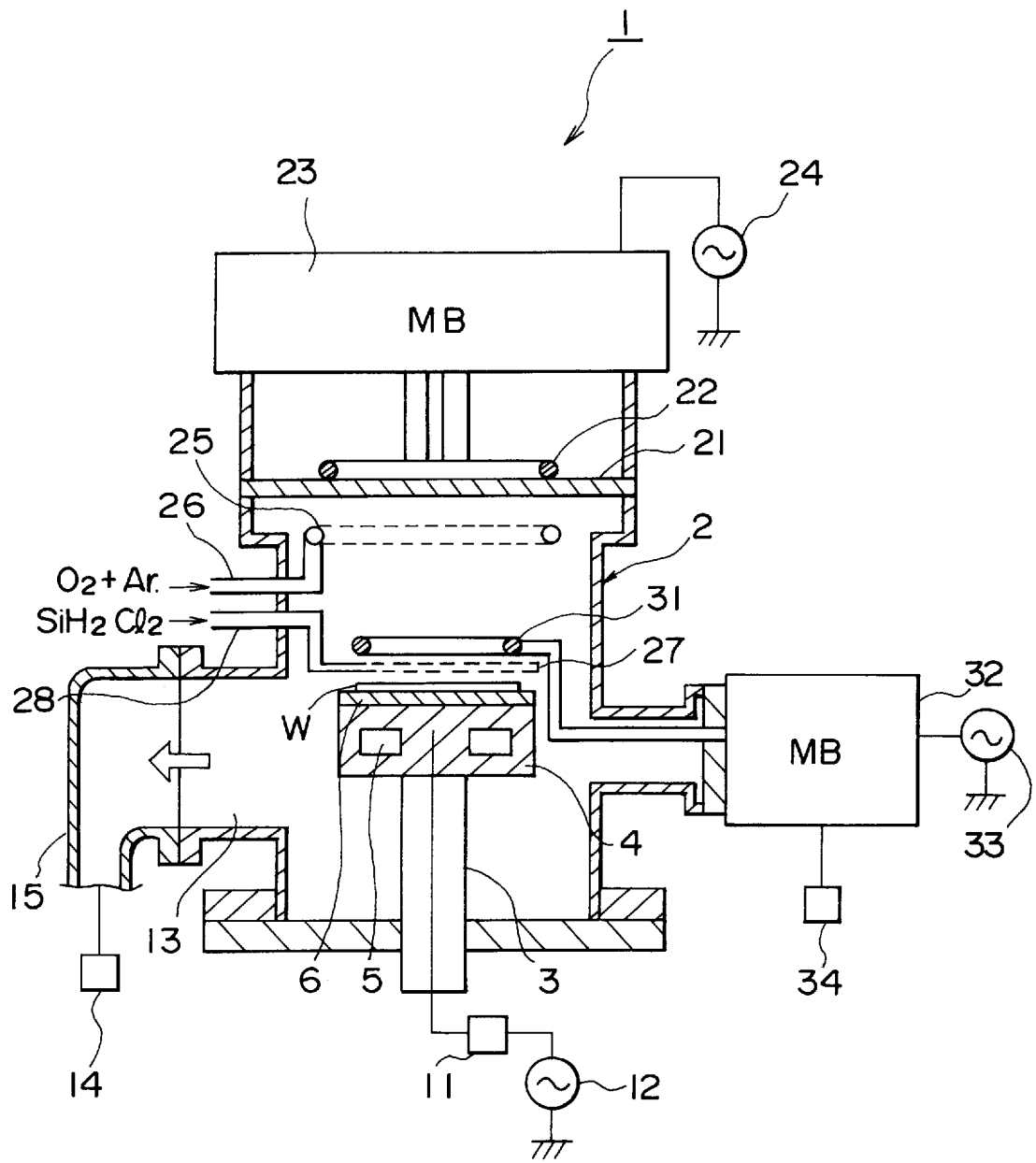
F I G. 1

PLASMA PROCESS METHOD AND APPARATUS

This application is a continuation of application Ser. No. 08/662,649, filed Jun. 13, 1996, abandoned, which application is entirely incorporated herein by reference.

BACKGROUND OF THE INVENTION

1. Technical Field of the Invention

The present invention relates to a plasma processing method and apparatus for subjecting a substrate to be processed to a predetermined plasma process in a plasma atmosphere. More specifically, it relates to a plasma processing method and apparatus for forming a predetermined thin film, such as an insulating film, on a substrate to be processed in a plasma.

2. Related Technical Information

During the process of fabricating a semiconductor device, processing called plasma chemical vapor deposition (CVD) is performed to form a film such as a predetermined thin conductive film or an insulating film such as one of silicon dioxide ($SiO_2$) on the surface of a substrate to be processed such as a semiconductor wafer (hereinafter called "wafer") W, in a plasma atmosphere.

Various different types of plasma CVD apparatus are used in the art for this plasma CVD processing. However, the degree of integration of circuitry has increased so far nowadays that extremely precise processing is necessary, and thus apparatuses that can generate high-density plasmas are used, such as inductively coupled plasma (ICP) CVD apparatuses, microwave plasma CVD apparatuses, and electron cyclotron resonance (ECR) plasma CVD apparatuses, whereby the film is formed under the downflow of a high-density plasma.

If one of these conventional apparatuses is used to embed very fine, high-aspect-ratio grooves such as those of a width of 0.2 $\mu$m and a depth of 1 $\mu$m in a film of silicon dioxide ($SiO_2$), the film tends to extend laterally over the top of the grooves and obstruct the opening portions of the grooves (this is called "overhang"). As a result, there is a danger of voids being generated within the grooves.

For that reason, the conventional process of embedding the groove includes the application of a high-frequency bias voltage of approximately 100 kHz to the wafer to cause the overhanging portions to be cut away by etching with ions such as argon ions (this process is called "shoulder cutting").

However, in a conventional apparatus in which a downflow method is used, the long distance between the generated plasma and the wafer causes problems such as the argon ions recombining before they reach the wafer, so that there is not a sufficiently high density of etchant ions such as argon ions in the vicinity of the wafer. In other words, the absolute number of these etchant ions is small.

Thus, in order to achieve the desired cutting effect with such a small absolute number of etchant ions, there is no option but to increase the bias voltage so that it is now necessary in the art to use a bias voltage of as high as 1.5 kV. But this leads to damage to the wafer from ion impacts.

SUMMARY OF THE INVENTION

An objective of the present invention is to provide a plasma processing method and apparatus together with a plasma film-formation method and apparatus that can be used to form a predetermined film that does not have any defects such as voids over tiny, high-aspect-ratio grooves and holes, without applying an excessively large bias voltage to the substrate to be processed (such as a wafer), which would cause damage.

A plasma processing method in accordance with this invention subjects a substrate to be processed to a predetermined plasma process in a plasma atmosphere and comprises the steps of:

introducing a plasma processing gas into a processing vessel and ionizing the plasma processing gas to form a first plasma within the processing vessel; and re-ionizing the plasma processing gas that has recombined in locations close to the substrate to be processed, to form a second plasma.

A plasma film-formation method in accordance with this invention causes a plasma to be generated within a processing vessel and also introduces a processing gas into the processing vessel and forms a film on a substrate to be processed to which is applied a bias voltage, and comprises the steps of:

introducing a plasma processing gas into an upper portion of the processing vessel and also introducing a film-formation processing gas into the vicinity of a substrate to be processed;

ionizing the plasma processing gas to cause a first plasma to be generated within the processing vessel; and re-ionizing the plasma processing gas that has recombined in locations close to the substrate to be processed, to form a second plasma.

Note that the purpose of the plasma processing gas of this invention is to create etchant ions such as argon ions by disassociating them in the plasma, to perform the previously described "shoulder cutting".

In addition, the first plasma generation means could be any of the various currently available plasma generating mechanisms such as an inductively coupled plasma (ICP) generation mechanism, a mechanism that generates a plasma by microwaves, or a mechanism that causes the generation of a plasma by ECR. Alternatively, it could be a mechanism that causes the generation of a plasma between opposing electrodes by the supply of radio-frequency electrical power, or a mechanism that generates a plasma by helicon waves.

A suitable second plasma generation means would be a mechanism for supplying radio-frequency electrical power to an antenna such as a looped antenna, to generate a plasma. In such a case, a configuration in which the radio-frequency electrical power is supplied to a single-turn loop antenna would greatly simplify the overall structure of the apparatus.

In accordance with the plasma film-formation method of this invention, a plasma processing gas is introduced into an upper part of the interior of a processing vessel and a film-formation processing gas is simultaneously introduced into the vicinity of the substrate to be processed. The plasma processing gas is ionized to form a first plasma and any of the plasma processing gas that has temporarily recombined in locations close to the substrate to be processed is re-ionized by a second plasma. As a result, the density of etchant ions used for cutting away overhangs around the openings of grooves can be increased. In other words, the number of etchant ions can be increased. This makes it possible to reduce the bias voltage applied to the substrate to be processed, preventing damage thereto.

Since the film-formation processing gas is introduced into the vicinity of the substrate to be processed, a desired film can be formed by halting the generation of the second plasma or reducing the power applied to the second plasma to such an extent that the film-formation processing gas does not disassociate.

The actual ionization voltage varies with the type of processing gas, but it is necessary to control the energy of the second plasma source to generate certain ions at a predetermined density. Therefore, an optimal degree of cutting of the overhang portions can be obtained if the configuration is such that the ion density of the second plasma is controlled. This could be done in such a manner that the recombined plasma processing gas is left alone for a fixed interval then re-ionized (by, for example, repeatedly generating and halting the plasma at fixed intervals), or by varying the output of the radio-frequency power that causes the generation of the plasma during the re-ionization of the recombined plasma processing gas.

A plasma film-formation apparatus in accordance with this invention enables time modulation of the radio-frequency electrical power that causes the generation of the plasma. Thus it can cause the plasma to be generated for a constant period then halt the generation, so that the ion density within the second plasma can be controlled. This makes it possible to implement the plasma film-formation method of embodiments of this invention as required. In other words, the ion density within the plasma is related to the time during which the maximum voltage is discharged at the instant of the ionization. Therefore, if some mechanism for time-modulating the radio-frequency electrical power is provided, as in the plasma film-formation apparatus described as embodiments of this invention, the ion density of the plasma can be controlled both simply and efficiently. Such a configuration enables "shoulder cutting" with etchant ions while the second plasma is being formed, alternating with the film-formation process while the second plasma is halted.

The second plasma generation means in the plasma film-formation apparatus in accordance with this invention is configured to receive radio-frequency electrical power and thereby generate a plasma. Since it is also provided with an output-varying mechanism for this radio-frequency electrical power, the radio-frequency output can be varied to enable control of the ion density in the second plasma.

BRIEF DESCRIPTION OF THE DRAWINGS

FIG. 1 is a vertical cross-sectional view through a plasma CVD apparatus of a first embodiment of the present invention;

DETAILED DESCRIPTION OF PREFERRED EMBODIMENTS

Figure 2:
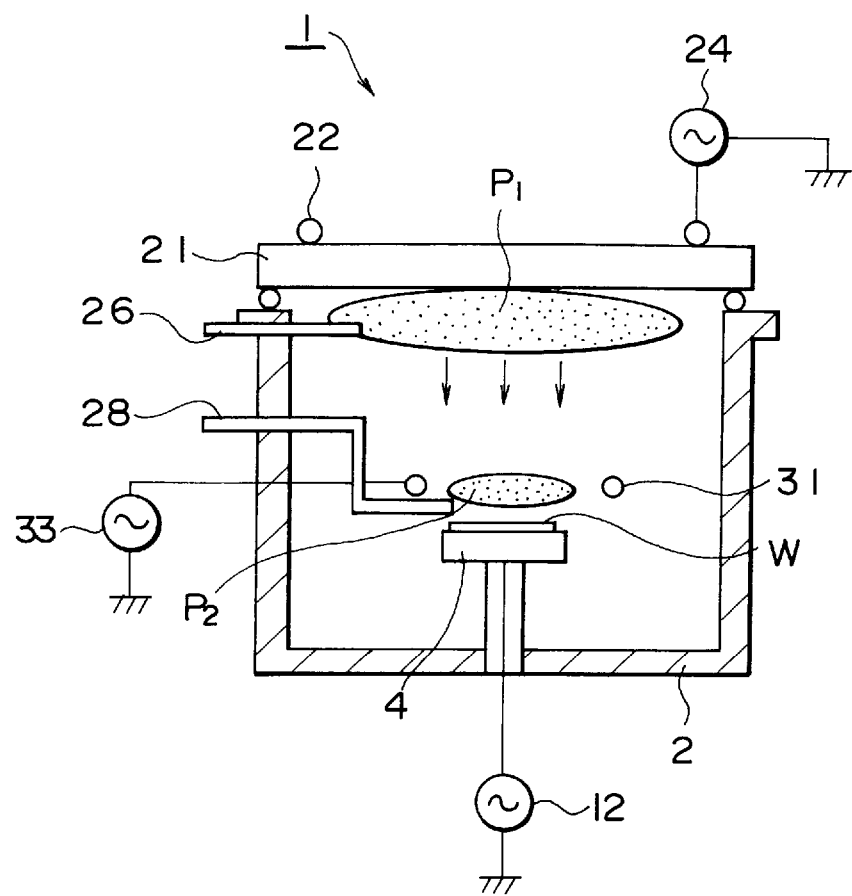
FIG. 2 is an illustrative view of the state in which plasmas are generated, when the plasma CVD apparatus of FIG. 1 is used for film formation.

A first embodiment of the present invention, applied to a plasma CVD apparatus, is described below with reference to the accompanying drawings.

A cross-sectional view of an ICP plasma CVD apparatus 1 in accordance with a first embodiment of this invention is shown schematically in FIG. 1. A processing vessel 2 of this plasma CVD apparatus 1 is configured in substantially circular cylindrical form of a material such as aluminum with a surface that has been subjected to processing to form a material such as alumite oxide. The interior of this processing vessel 2 can be freely sealed hermetically and it is grounded. Note that this processing vessel 2 could also be formed of titanium.

A mounting stand 4 for holding a 12-inch semiconductor wafer (hereinafter called "wafer") W, which is the substrate to be processed, is accommodated within the processing vessel 2 on an insulating support member 3 formed of a material such as a ceramic or quartz. This mounting stand 4 is of a material such as aluminum with a surface that has been subjected to processing to form a material such as alumite oxide, and cooling passages 5 are formed in the interior thereof. Thus coolant such as water that is supplied from the outside can be passed through these cooling passages 5 to cool the wafer W to a predetermined temperature.

Note that the provision of a heating means such as a ceramic heater, a suitable temperature sensor, and a temperature control mechanism would make it possible to maintain the wafer W both accurately and automatically at that predetermined temperature.

An electrostatic chuck 6 is provided on the mounting stand 4 to attract and hold the wafer W. This electrostatic chuck 6 could have a configuration consisting of a thin conductive film that is sandwiched from above and below by a polyimide resin. When a predetermined DC voltage is applied thereto from a high-voltage DC power source (not shown) which is located outside the processing vessel 2, the Coulomb force generated thereby attracts and holds the wafer W.

Note that, if an annular focussing ring of a conductive material such as monocrystalline silicon is provided around the periphery above the mounting stand 4 so as to surround the electrostatic chuck 6, the plasma density around the wafer W can be adjusted to ensure that the plasma density over the wafer W can be made more uniform.

A high-frequency bias voltage of, for example, 100 kHz is applied to the mounting stand 4 through a regulator 11 from a high-frequency power source 12 for applying a bias voltage.

An exhaust port 13 is formed in a lower portion of the side wall of the processing vessel 2 and an exhaust pipe 15 is connected to this exhaust port 13 via an evacuation means 14 such as a vacuum pump or a turbo-molecular pump. The operation of the evacuation means 14 enables the interior of the processing vessel 2 to be evacuated to a predetermined low pressure such as any desired pressure between 10 mTorr and 100 mTorr. In such a case, the configuration could be such that a pressure sensor is provided in the processing vessel 2 and the predetermined low pressure is maintained on the basis of a detection signal from this pressure sensor. The exhaust port 13 could also be formed in the base of the processing vessel 2.

A plate 21 of an insulating material such as quartz is provided sealed into an upper portion of the processing vessel 2, in other words, a portion equivalent to the ceiling thereof. An antenna 22 in the form of a single-turn loop is disposed above this quartz plate 21 as means for generating a first plasma. The configuration is such that radio-frequency electrical power of a strength sufficient to cause the generation of an inductively coupled plasma, such as 13.56 MHz, is supplied to this antenna 22 from a radio-frequency power source 24 via a matching box 23.

An annular gas distribution member 25 is provided below the quartz plate 21 within the processing vessel 2 as a member that configures a first gas introduction means for introducing a plasma processing gas. A large number of distribution vents are formed in this gas distribution member 25 with the configuration being such that, when a predetermined processing gas (such as oxygen and argon) is supplied from a first gas introduction pipe 26, that processing gas is dispersed from these distribution vents and is introduced into the upper portion of the processing vessel 2. This gas distribution member 25 is made of a material such as quartz.

Similarly, an annular gas distribution member 27 is disposed close above the mounting stand 4 as a second gas introduction means for introducing a film-formation processing gas. The configuration is such that, when a predetermined film-formation processing gas (such as $SiH_2Cl_2$) is introduced from the second gas introduction pipe 28 into this gas distribution member 27, the film-formation processing gas is distributed close above the wafer W from a large number of distribution vents formed in the gas distribution member 27. This configuration ensures that precursor gases $SiH_2Cl_2O$, $SiH_2Cl_2O_2$, $SiH_2Cl_2O_3$, and $SiH_2Cl_2O_4$ are created from this $SiH_2Cl_2$ introduced into the processing vessel 2.

It should be noted that this embodiment of the present invention concerns a configuration in which the second gas introduction pipe 28 is provided in a side wall of the processing vessel 2, as the second gas introduction means for introducing the film-formation processing gas, and the gas distribution member 27 that is connected to the second gas introduction pipe 28 is disposed close above the wafer W. However, the configuration could equally well be one in which the film-formation processing gas is introduced below the periphery of the wafer W, that is, from below the periphery of the mounting stand 4. In such a case, it would not be necessary to dispose the gas distribution member above the wafer W, which means that sputtering of the materials by the plasma is reduced, thus reducing the amount of contamination within the processing vessel 2.

An antenna 31 in the form of a single-turn loop is disposed close above the upper surface of the gas distribution member 27 as means for generating a second plasma. The configuration is such that radio-frequency electrical power of a strength sufficient to cause the generation of an inductively coupled plasma, such as 13.56 MHz, is supplied to this antenna 31 from a radio-frequency power source 33 via a matching box 32.

Figure 4:
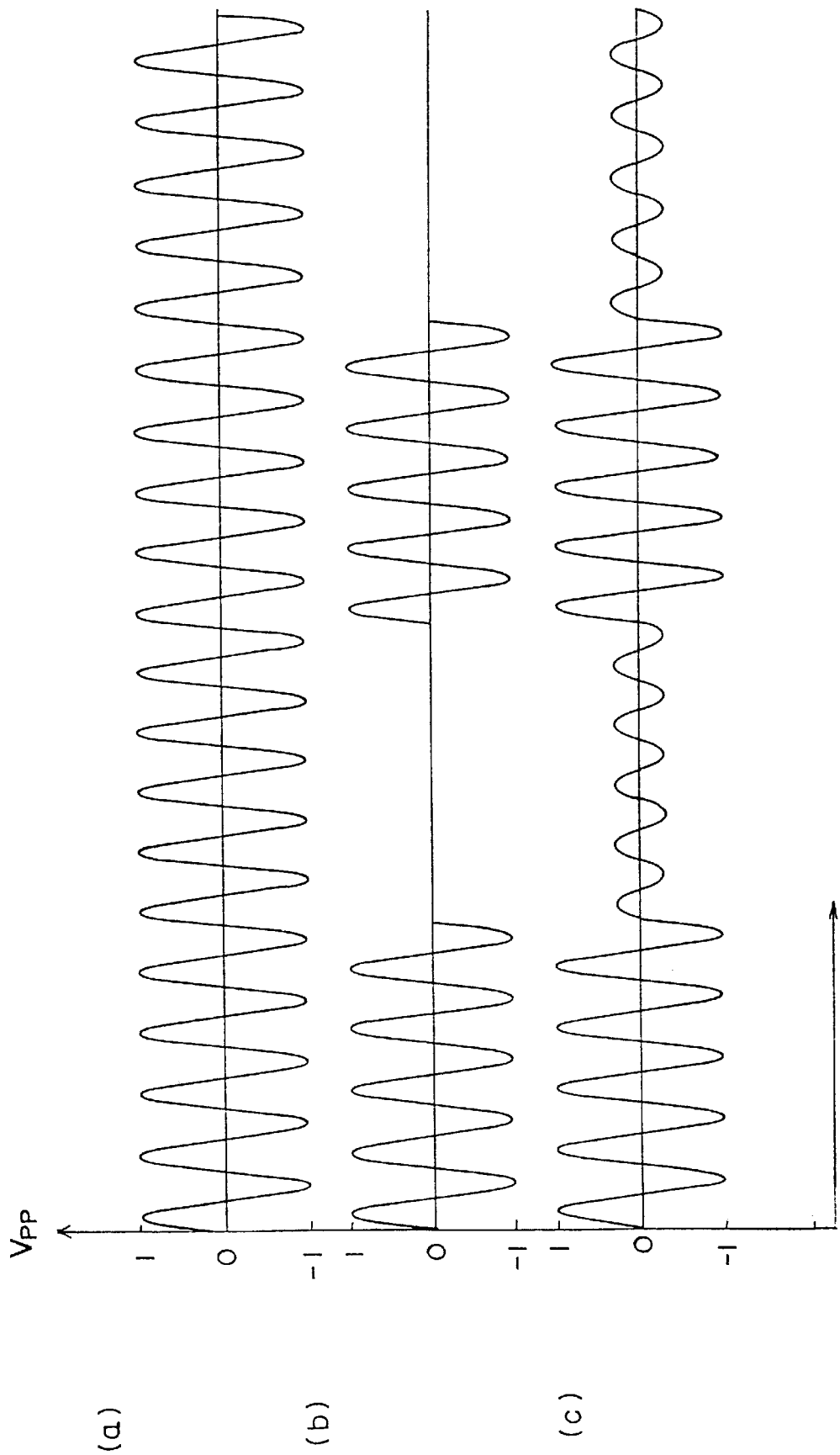
FIG. 4 shows graphs of time modulation and output variations in the radio-frequency electrical power of the second plasma generation means.

The radio-frequency electrical power from the radio-frequency power source 33 is modulated by a time modulation device 34 in such a manner that the power is output for 5 microseconds then halted for a further 5 microseconds, as shown in (b) of FIG. 4. This time modulation can be varied so that the output time and output-halted time are controlled. Thus it can be set so that the power is output for 8 microseconds then halted for 4 microseconds, for example.

The second plasma generation means could equally well be configured in such a manner that it is provided with a mechanism for varying the output of the radio-frequency electrical power, with effects as shown in (c) of FIG. 4.

The ion density within the second plasma can be controlled by leaving the recombined plasma processing gas for a fixed interval then re-ionizing it (by, for example, repeatedly generating and halting the plasma at fixed intervals).

The main components of the plasma CVD apparatus 1 of this first embodiment are configured as described above. The description now turns to the processing performed when a film of an oxide (e.g., $SiO_2$) is to be formed on a wafer W of silicon, to embed fine pattern lines within this oxide film. First of all, after the wafer W has been attracted to and held by the electrostatic chuck 6, the pressure within the processing vessel 2 is reduced by the evacuation means 14. When the predetermined pressure has been achieved, gases such as oxygen and argon are introduced into the top of the processing vessel 2 from the first gas introduction pipe 26, a gas such as $SiH_2Cl_2$ is introduced to close above the wafer W from the second gas introduction pipe 28, and the pressure within the processing vessel 2 is set and maintained at a suitable level such as 20 mTorr.

When radio-frequency electrical power at 13.56 MHz and 1.2 kW is supplied from the radio-frequency power source 24 to the antenna 22, a first plasma P1 is created in the upper portion of the processing vessel 2, as shown in FIG. 2, so that the introduced oxygen and argon gases are ionized to produce oxygen and argon ions.

At the same time, radio-frequency electrical power at 13.56 MHz and 400 W is supplied from the radio-frequency power source 33 to the antenna 31, to form a second plasma P2 close above the wafer W, as shown in FIG. 2. This second plasma P2 makes it possible to increase the number of argon ions, even if they have recombined and their number has decreased.

A high-frequency bias voltage, of, for example, −500 V at 100 kHz, is also applied to the mounting stand 4 from the high-frequency power source 12 to ensure that the argon ions are incident on the wafer W. This makes it possible for the argon ions to etch the overhang portions covering the openings of the grooves, removing them.

When the supply of radio-frequency electrical power from the radio-frequency power source 33 is halted, the deposition seeds amongst the precursors are deposited on the surface of the wafer W, so that an oxide film ($SiO_2$) is formed on the surface of the wafer W. Repeating this film-formation process and the process of etching the overhang portions with the argon ions ensures that the grooves in the wafer W can be buried efficiently without defects such as voids forming in the grooves.

During this film-formation process, the first plasma P1 that generates the argon ions is induced in the upper part of the processing vessel 2. A number of these argon ions recombine before they reach the wafer W and, as a result, the absolute number of the argon ions decreases. However, since the second plasma P2 is induced close to the wafer W, the argon gas is re-ionized by this second plasma P2, so that a sufficiently large number appear for etching the overhang portions of the groove openings. Thus the overhang portions can be efficiently and sufficiently etched during the embedding process, with no likelihood of defects such as voids forming within the grooves, even with a bias voltage of −500 V, which is less than half that in a conventional inductively coupled plasma CVD apparatus. Since the argon ions are made incident on the wafer W by such a low bias voltage, there is no danger of the wafer W becoming damaged by impacts.

Since the radio-frequency electrical power that induces the second plasma P2 can be modulated in a temporal fashion by the time modulation device 34, the times during which the argon is ionized can be controlled so that the number of argon ions can be controlled. Thus the number of etchant ions can be controlled efficiently in correspondence with factors such as the dimensions of the grooves and the type of processing gas introduced during the film-formation process. These processes of forming a film and etching away overhang portions with argon ions can be alternated as appropriate.

It should be noted that the oxygen and argon gases that form the plasma processing gas of this embodiment are introduced into the processing vessel 2 by the first gas introduction pipe 26 provided in the side wall of the processing vessel 2 and the gas distribution member 25 provided in the top of the processing vessel 2. However, a roughly flat showerhead having a large number of distribution vents could equally well be provided on the lower surface of the quartz plate 21 instead.

Figure 3:
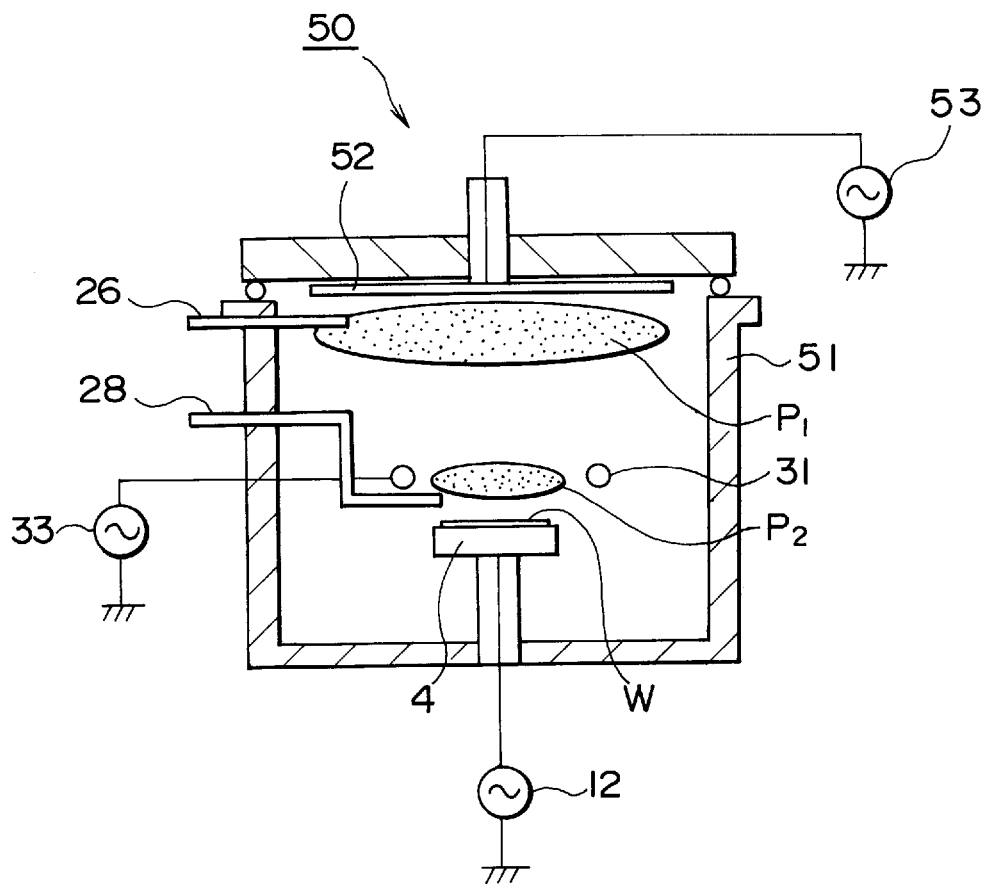
FIG. 3 is an illustrative view of the configuration of a plasma CVD apparatus relating to a second embodiment of this invention.

To induce the first plasma P1 with this embodiment, an inductively coupled method is used in which radio-frequency electrical power is supplied to the antenna 22 provided above the quartz plate 21. Alternatively, the configuration could be that of a plasma CVD apparatus 50 relating to a second embodiment of this invention as shown in FIG. 3, wherein an upper electrode 52 is provided facing a mounting stand 4 in an upper portion of a processing vessel 51, radio-frequency electrical power is supplied to the upper electrode 52 which is insulated from the grounded processing vessel 51, and the first plasma P1 is induced by glow discharge. Note that components in FIG. 3 denoted by the same reference numbers as those in FIG. 1 have the same configuration.

The plasma CVD apparatus 50 relating to this second embodiment uses a horizontal, flat-plate type of configuration which makes it possible to have a comparatively simple apparatus structure and which is suitable for large-diameter wafers. In the same manner as the plasma CVD apparatus 1 of the first embodiment, the second plasma P2 in the plasma CVD apparatus 50 relating to this second embodiment can naturally generate a sufficiently large number of ions for etching the overhang portions, so that film-formation processing can be implemented without any voids forming in the grooves, even with a low bias voltage. Note that the upper electrode 52 in the plasma CVD apparatus 50 of this second embodiment could have a showerhead configuration, as described previously, so that the plasma processing gas can be introduced into the processing vessel 51 through the upper electrode 52.

Figure 5:
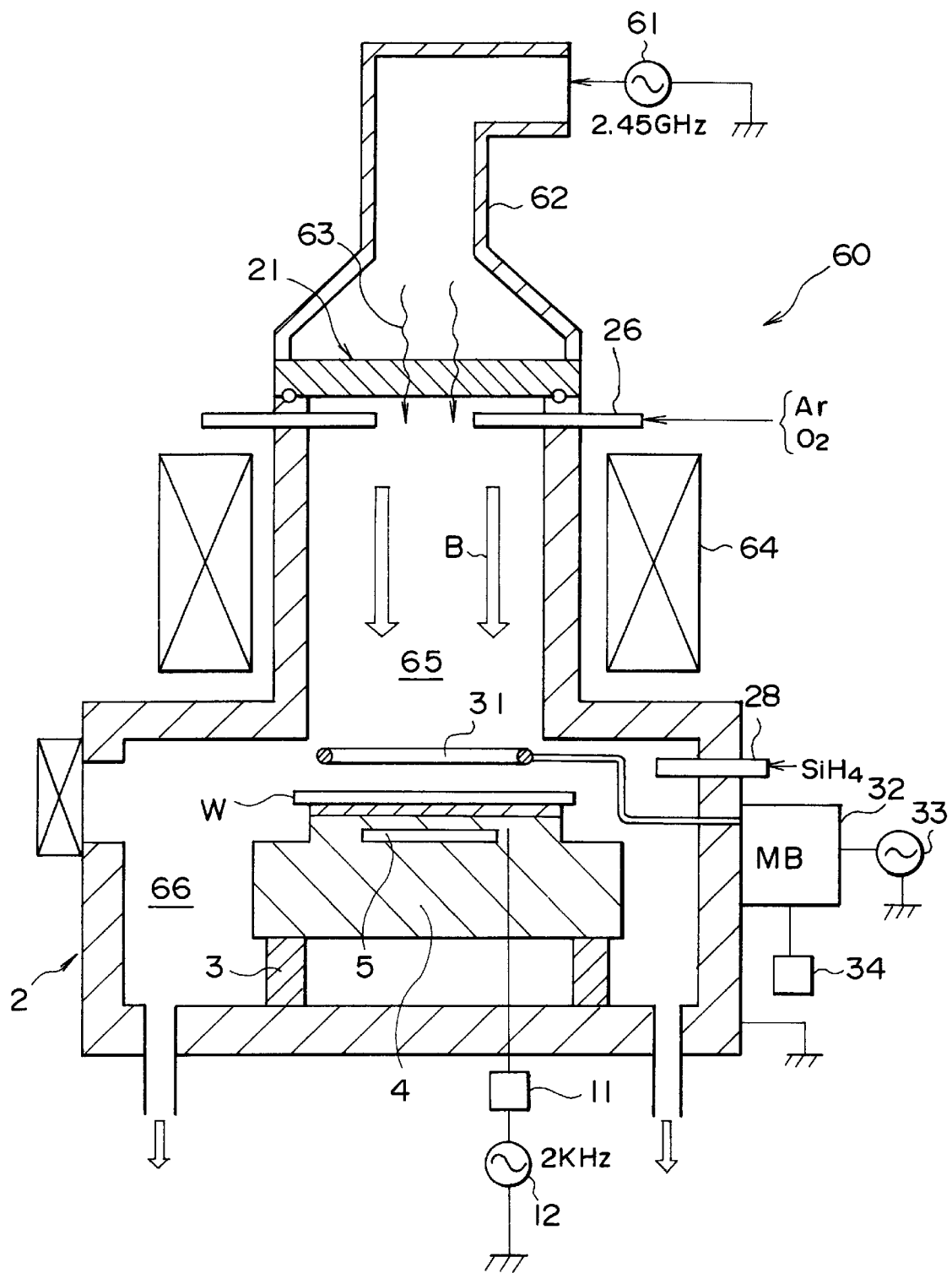
FIG. 5 is an illustrative view of the configuration of a plasma CVD apparatus relating to a third embodiment of this invention.

An electron cyclotron resonance (ECR) plasma film-formation apparatus 60 relating to a third embodiment of this invention is shown in FIG. 5. The interior of a vacuum vessel 2 is divided into a plasma chamber 65 positioned at the top and a reaction chamber 66 communicating therewith at the bottom. A waveguide 62 is provided outside a transparent window 21 and this waveguide 62 is connected to a radio-frequency source 61 as means for supplying radio-frequency power for generating a plasma at, for example, 2.45 GHz. This configuration enables radio-frequency power generated by the radio-frequency source 61 to be guided by the waveguide 62 through the transparent window 21 and into the plasma chamber 65.

Means such as an annular electromagnetic coil 64 is disposed close around the periphery of the inner wall that divides the plasma chamber 65, as means for applying a magnetic field. This forms a magnetic field B of, for example, 875 Gauss directed from the top of the interior of the plasma chamber 65 downward, to provide suitable conditions for an ECR plasma.

Thus radio-frequency power of 2.45 GHz from the radio-frequency source 61 for plasma generation is transferred through the waveguide 62 to the ceiling portion of the vacuum vessel 2 and passes through the transparent window 21 there, so that microwaves 63 are introduced into the plasma chamber 65. The magnetic field B is applied by the electromagnetic coil 64 to the interior of the plasma chamber 65 from the top to the bottom thereof, and the mutual reactions between the magnetic field B and the microwaves 63 induces a field that is E (electric field) times B (magnetic field) to create electron cyclotron resonance. This resonance ionizes the argon and oxygen ions and increases their density.

The high-density plasma generated in the plasma chamber 65 is sucked towards the mounting stand 4 to which is applied a negative high-density bias voltage, so that it flows downward into the reaction chamber 66.

In this embodiment too, the second plasma P2 is formed close above the wafer W when radio-frequency electrical power of a frequency of 13.56 MHz and, for example, 400 W is supplied from the radio-frequency power source 33. Therefore, the number of argon ions can be increased again by the second plasma P2, even if they have been depleted by recombination, and the overhang portions can be etched and removed by these argon ions. This makes it possible to implement the formation of a film with no voids in the grooves and with no damage, even with a small bias voltage.

It should be noted that, although the above embodiments were described with reference to a wafer as the substrate to be processed, the present invention is not limited thereto and it can equally well be applied to the formation of a film on other substrates such as an LCD substrate.

What is claimed is:

1. A plasma processing method for subjecting a substrate to be processed to a predetermined plasma process in a plasma atmosphere, comprising the steps of:

introducing a plasma processing gas into a processing vessel and ionizing said plasma processing gas to form a plasma within said processing vessel, said plasma including ions acting as an etchant; and re-ionizing portions of plasma that have recombined to generate etchant acting ions at locations close to said substrate to be processed;

halting said step of re-ionizing whereby deposition seeds of precursors are deposited on a surface of said substrate to permit formation of a film; and resuming said step of re-ionizing whereby etchant acting ions generated during said ionizing step and during said re-ionizing step etch overhang portions of said film.

2. A plasma processing apparatus for subjecting a substrate to be processed to a predetermined plasma process in a plasma atmosphere, wherein said plasma processing apparatus comprises:

processing gas introduction means for introducing a plasma processing gas into a processing vessel;

first plasma generation means for ionizing said plasma processing gas to form a plasma within said processing vessel, said plasma including ions acting as an etchant;

second plasma generation means for re-ionizing portions of said plasma that have recombined to generate etchant acting ions at locations close to said substrate to be processed; and control means for selectively halting operation of said second plasma generation means whereby deposition seeds of precursors are deposited on a surface of said substrate to permit formation of a film on said surface, and resuming operation of said second Plasma generation means whereby etchant acting ions generated by said first plasma generation means and by said second plasma generation means etch overhang portions of said film.

3. The plasma processing apparatus of claim 2, wherein:

said second plasma generation means is an inductively coupled plasma generation means for receiving radio-frequency electrical power.

4. A plasma CVD film-formation method for causing a plasma to be generated within a processing vessel and also introducing a processing gas into said processing vessel and forming a film on a substrate to be processed, said plasma film formation method comprising the steps of:

applying a bias voltage to said substrate to be processed;

introducing a plasma processing gas into an upper portion of said processing vessel and also introducing a film-formation processing gas into said processing vessel in the vicinity of a substrate to be processed;

ionizing said plasma processing gas to cause a plasma to be generated within said processing vessel, said plasma including ions acting as an etchant; and re-ionizing portions of said plasma that have recombined to generate etchant acting ions at locations close to said substrate to be processed;

halting said step of re-ionizing whereby deposition seeds of precursors are deposited on a surface of said substrate to permit formation of a film; and resuming said step of re-ionizing whereby etchant acting ions generated during said ionizing step and during said re-ionizing step etch overhang portions of said film.

5. The plasma film-formation method of claim 4, wherein:

etchant acting ion density within said plasma is controlled by leaving said portions of said plasma processing gas that have recombined in a recombined condition for a fixed interval and then performing said re-ionizing step.

6. The plasma film-formation method of claim 4, wherein:

etchant acting ion density within said plasma is controlled during said step of re-ionizing by varying an output of a radio-frequency electrical power used for forming said plasma.

7. A film-formation apparatus for plasma CVD processing which involves the generation of plasma within a processing vessel and introduction of a processing gas into said processing vessel to form a film on a substrate to be processed, said film-formation apparatus comprising:

means for applying a bias voltage to a substrate within said processing vessel;

first processing gas introduction means for introducing a plasma processing gas into said processing vessel;

second processing gas introduction means for introducing a film-formation processing gas into said processing vessel in the vicinity of said substrate to be processed;

first plasma generation means for ionizing said plasma processing gas to form a plasma within said processing vessel, said plasma including ions acting as an etchant;

second plasma generation means for re-ionizing portions of said plasma that have recombined to generate etchant acting ions at locations close to said substrate to be processed; and control means for selectively halting operation of said second plasma generation means whereby deposition seeds of precursors are deposited on a surface of said substrate to permit formation of a film on said surface, and resuming operation of said second plasma generation means whereby etchant acting ions generated by said first plasma generation means and by said second plasma generation means etch overhang portions of said film.

8. The plasma film-formation apparatus of claim 7, wherein:

said second plasma generation means is an inductively coupled plasma generation means for receiving radio-frequency electrical power.

9. The plasma film-formation apparatus of claim 7, wherein:

said second plasma generation means comprises a time-modulation mechanism for radio-frequency electrical power.

10. The plasma film-formation apparatus of claim 7, wherein:

said second plasma generation means comprises a variable-output mechanism for radio-frequency electrical power.

* * * * *